US012044481B2

United States Patent
Horng et al.

(10) Patent No.: US 12,044,481 B2
(45) Date of Patent: Jul. 23, 2024

(54) COOLING DEVICE WITH EASY-TO-WELD STRUCTURE

(71) Applicant: SUNONWEALTH ELECTRIC MACHINE INDUSTRY CO., LTD., Kaohsiung (TW)

(72) Inventors: Alex Horng, Kaohsiung (TW); Ming-Tsung Li, Kaohsiung (TW); Chi-Ting Yeh, Kaohsiung (TW)

(73) Assignee: SUNONWEALTH ELECTRIC MACHINE INDUSTRY CO., LTD., Kaohsiung (TW)

( * ) Notice: Subject to any disclaimer, the term of this patent is extended or adjusted under 35 U.S.C. 154(b) by 0 days.

(21) Appl. No.: 18/498,714

(22) Filed: Oct. 31, 2023

(65) Prior Publication Data

US 2024/0060725 A1 Feb. 22, 2024

Related U.S. Application Data

(62) Division of application No. 17/407,639, filed on Aug. 20, 2021, now Pat. No. 11,846,470.

(30) Foreign Application Priority Data

Nov. 25, 2020 (TW) ................................ 109141372

(51) Int. Cl.
*F28D 15/04* (2006.01)
*B23P 15/26* (2006.01)

(52) U.S. Cl.
CPC .............. *F28D 15/04* (2013.01); *B23P 15/26* (2013.01); *B23P 2700/09* (2013.01)

(58) Field of Classification Search
CPC .... B23P 2700/09; B23P 15/26; H01L 23/427; F28F 2275/06; F28F 3/044; F28D 2015/0291; F28D 15/04; F28D 15/043
See application file for complete search history.

(56) References Cited

U.S. PATENT DOCUMENTS 10,448,540 B2 * 10/2019 Hou ..................... H05K 7/2029
10,591,222 B2    3/2020 Zhou et al.
(Continued)

FOREIGN PATENT DOCUMENTS

DE      102015100301    7/2016
TW      201403017       1/2014
TW      202026807       7/2020

*Primary Examiner* — Tho V Duong
(74) *Attorney, Agent, or Firm* — WPAT, P.C

(57) ABSTRACT

A cooling device includes a partitioning board abutting inner faces of two boards, respectively. A chamber is defined between the partitioning board and one of the two boards. Another chamber is defined between the partitioning board and another of the two boards and intercommunicates with the chamber via an intercommunication port and a backflow port of the partitioning board. A pump drives a working fluid to circulate in the two chambers. Two welding channels are formed on outer faces of the two boards and surround the two chambers, respectively. The smallest distance between a channel bottom face of each annular welding channel and the inner face of a respective board having the annular welding channel is smaller than that between the inner and outer faces of the respective board. The two boards are coupled to the partitioning board along the annular welding channels by laser welding.

13 Claims, 16 Drawing Sheets

(56) References Cited

U.S. PATENT DOCUMENTS

| | | | |
|---|---|---|---|
| 10,739,081 B2 | 6/2020 | Zhou et al. | |
| 10,816,274 B2 | 10/2020 | Naito et al. | |
| 10,842,043 B1 | 11/2020 | Zhang et al. | |
| 2017/0138673 A1* | 5/2017 | Aoki | F28D 15/04 |
| 2018/0087844 A1 | 3/2018 | Huang | |
| 2018/0093423 A1* | 4/2018 | Yamagishi | F16B 5/08 |
| 2018/0164043 A1* | 6/2018 | Kurashima | F28D 15/02 |
| 2019/0247964 A1 | 8/2019 | Zhou et al. | |
| 2019/0360760 A1* | 11/2019 | Aoki | F28D 15/04 |
| 2020/0003501 A1 | 1/2020 | Wakaoka | |
| 2020/0025457 A1 | 1/2020 | Lin | |
| 2020/0205316 A1* | 6/2020 | Weng | H05K 7/2039 |
| 2020/0240718 A1* | 7/2020 | Wakaoka | F28D 15/0233 |
| 2020/0240719 A1* | 7/2020 | Wakaoka | F28F 3/086 |
| 2020/0292245 A1* | 9/2020 | Naito | F28D 15/0233 |

* cited by examiner

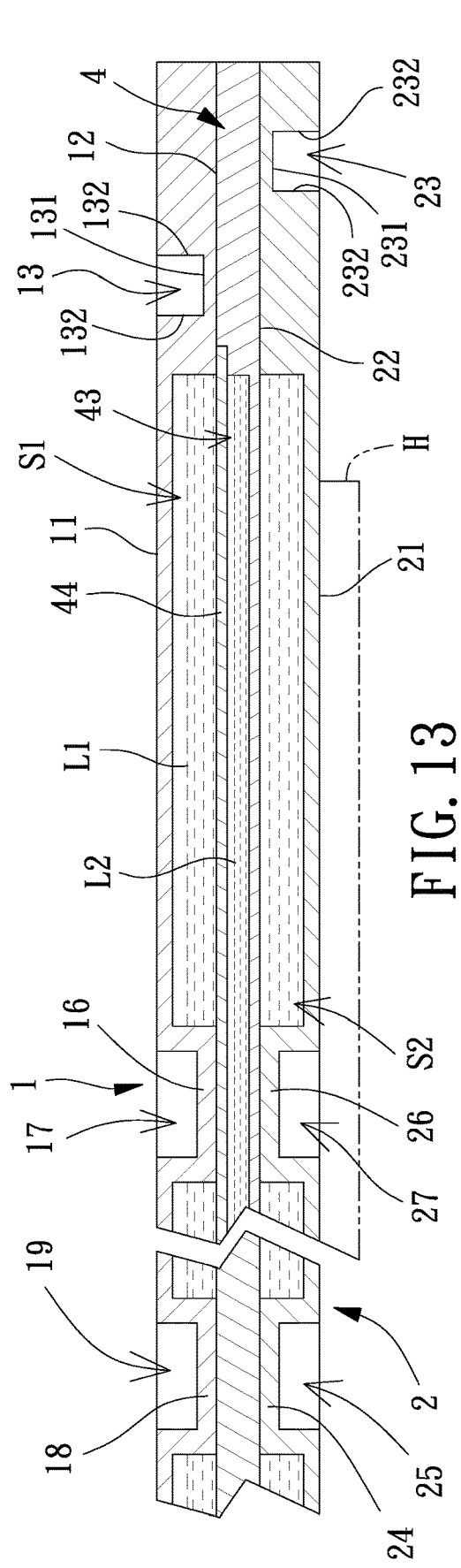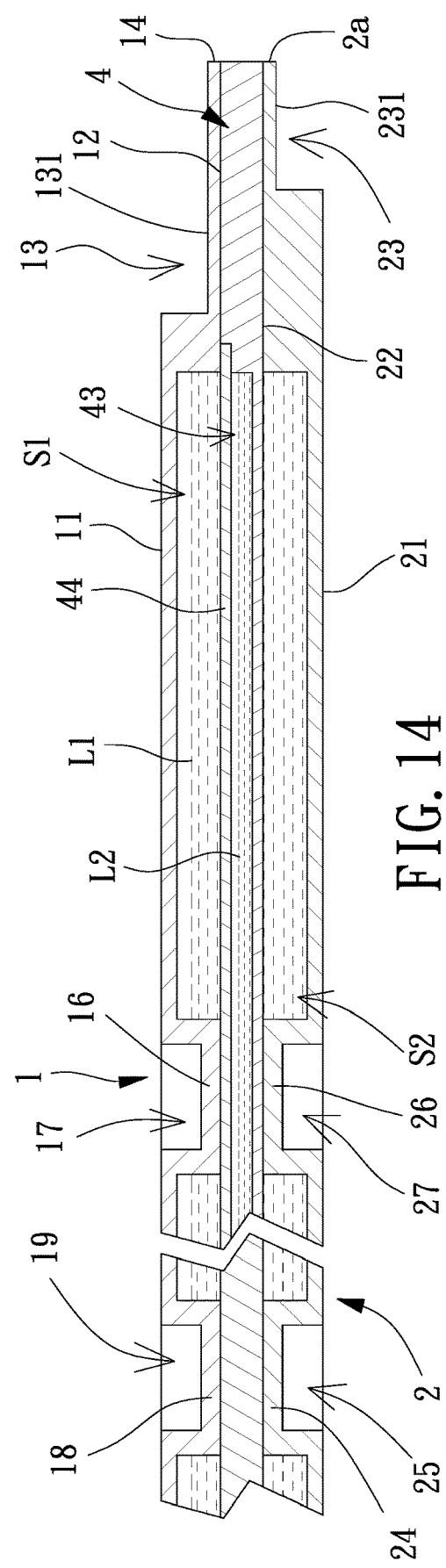

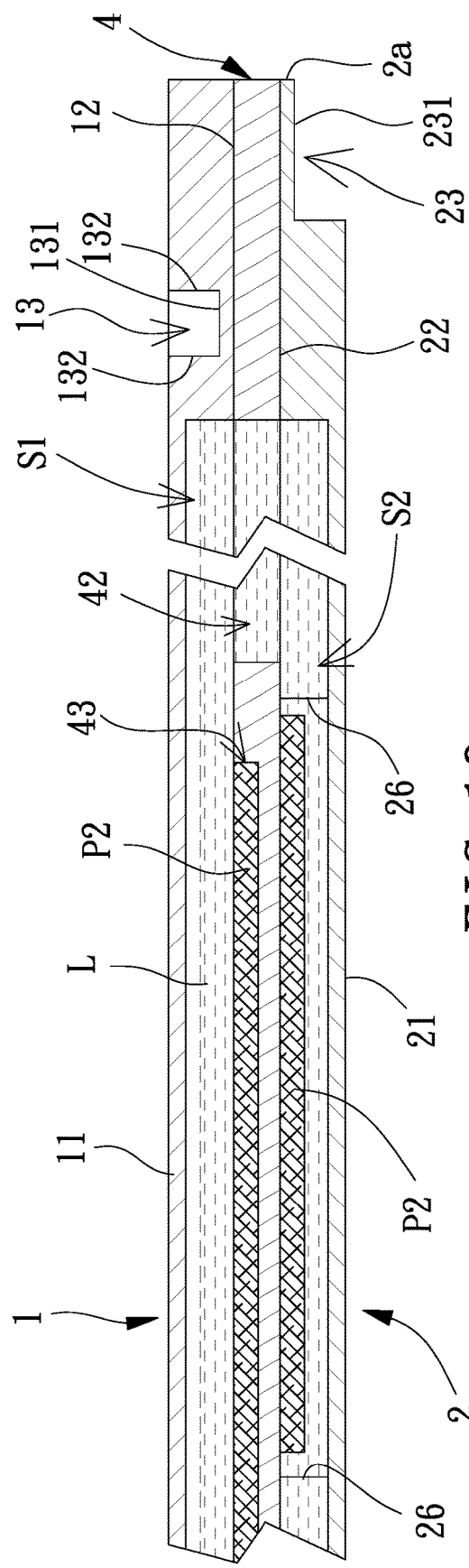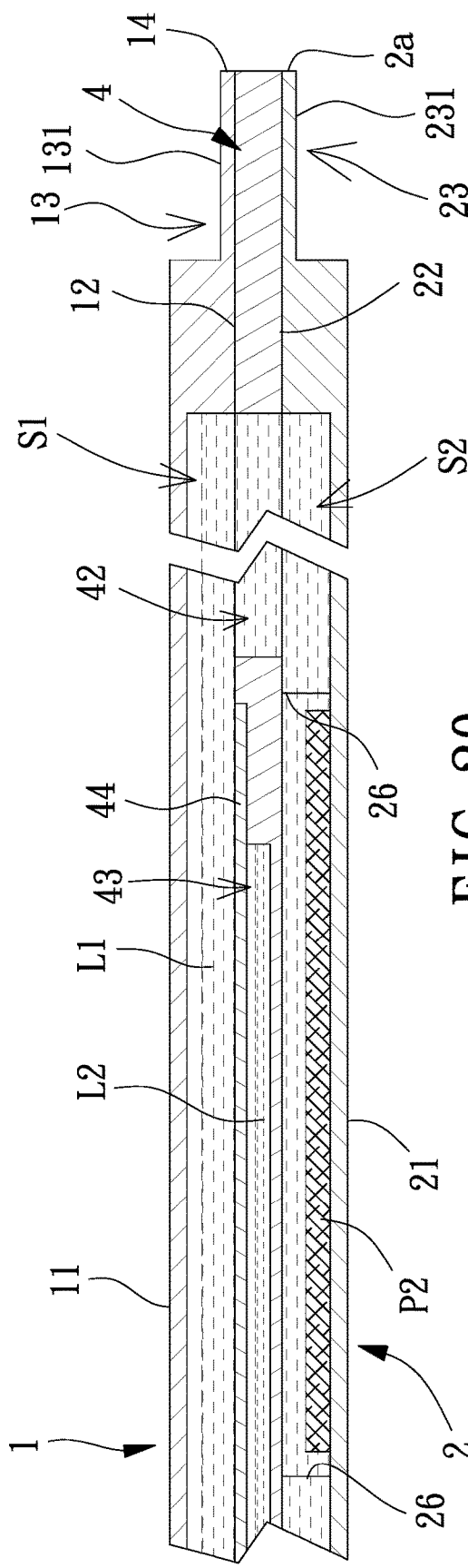

COOLING DEVICE WITH EASY-TO-WELD STRUCTURE

CROSS REFERENCE TO RELATED APPLICATION

This is a divisional application of U.S. patent application Ser. No. 17/407,639 filed on Aug. 20, 2021, and claims the benefit of Taiwan application serial No. 109141372, filed on Nov. 25, 2020, and the entire contents of which are incorporated herein by reference.

BACKGROUND OF THE INVENTION

1. Field of the Invention

The present invention relates to a cooling device and, more particularly, to a cooling device with an easy-to-weld structure adapted to maintain an electronic device at suitable working temperature.

2. Description of the Related Art

FIG. 1 is an enlarged cross sectional view of a conventional cooling device 9. The conventional cooling device 9 includes a lower board 91 and an upper board 92. The lower board 91 is substantially a flat board. The upper board 92 is pressed to be partially-protruded. Thus, a chamber 93 is formed between the lower board 91 and the upper board 92 after they are welded together by laser welding. A capillary structure 94 is formed on an inner face of the upper board 92 by sintering. The capillary structure 94 and a working fluid L are located in the chamber 93. Thus, the lower board 91 can abut a heat source H of an electronic device to absorb heat of the heat source H. The working fluid L proceeds with a gas-liquid phase change in the chamber 93 to transfer the heat of the heat source H outwards. Thus, the heat source H can be maintained at a suitable working temperature, avoiding overheating of the electronic device. An example of such a conventional cooling device 9 is disclosed in Taiwan Patent Publication No. 202026807.

However, even though both the lower board 91 and the upper board 92 are thin boards, the thickness of the welding portion of each of the lower board 91 and the upper board 92 is the same as the thickness of the remaining portion of the respective board. Thus, during laser welding of the lower board 91 and the upper board 92, the time for the materials of the welding portions of the lower board 91 and the upper board 92 to form a weld pool after absorbing the laser energy is irrelevant to the selected welding location. In addition, the time cannot be shortened, and the energy consumed by welding cannot be reduced. As a result, it is difficult to improve the laser welding efficiency of the conventional cooling device 9 and difficult to further reduce the laser welding costs.

Thus, it is necessary to improve the conventional cooling device.

SUMMARY OF THE INVENTION

To solve the above disadvantages, it is an objective of the present invention to provide a cooling device with an easy-to-weld structure. At least one board of the cooling device has a relatively thinner portion at the welding location to shorten the time required for forming the weld pool from the material while reducing the energy consumed by welding.

It is another objective of the present invention to provide a cooling device with an easy-to-weld structure, which can increase the welding convenience and the welding quality.

It is a further objective of the present invention to provide a cooling device with an easy-to-weld structure, which can improve the cooling efficiency to a heat source.

It is still another objective of the present invention to provide a cooling device with an easy-to-weld structure, which can increase the assembling convenience.

As used herein, the term "a", "an" or "one" for describing the number of the elements and members of the present invention is used for convenience, provides the general meaning of the scope of the present invention, and should be interpreted to include one or at least one. Furthermore, unless explicitly indicated otherwise, the concept of a single component also includes the case of plural components.

As used herein, the term "coupling", "engagement", "assembly", or similar terms is used to include separation of connected members without destroying the members after connection or inseparable connection of the members after connection. A person having ordinary skill in the art would be able to select according to desired demands in the material or assembly of the members to be connected.

In an aspect of the present invention, a cooling device with an easy-to-weld structure includes two boards each including an outer face and an inner face opposite to the outer face. The inner faces of the two boards abut each other. The two boards together define a chamber therebetween. A working fluid is filled in the chamber. At least one of the two boards includes an annular welding channel on the outer face thereof. The annular welding channel surrounds the chamber and has a channel bottom face. The smallest distance between the channel bottom face and the inner face of a respective one of the two boards which includes the annular welding channel is smaller than the smallest distance between the outer face and the inner face of the respective one of the two boards which includes the annular welding channel. The two boards are coupled along the annular welding channel by laser welding.

In an aspect of the present invention, a cooling device with an easy-to-weld structure includes two boards, a partitioning board, and a pump. Each of the two boards includes an outer face and an inner face opposite to the outer face. The partitioning board abuts the inner faces of the two boards. A first chamber is defined between the partitioning board and one of the two boards. A second chamber is defined between the partitioning board and another of the two boards. The first chamber intercommunicates with the second chamber via an intercommunication port and a backflow port of the partitioning board. The pump is configured to drive a working fluid to circulate in the first chamber and the second chamber. The outer face of each of the two boards includes an annular welding channel. The welding channels of the two boards surround the first chamber and the second chamber, respectively. Each annular welding channel has a channel bottom face. The smallest distance between the channel bottom face of each annular welding channel and the inner face of a respective one of the two boards which includes the annular welding channel is smaller than the smallest distance between the outer face and the inner face of the respective one of the two boards which includes the annular welding channel. The two boards are coupled to the partitioning board along the annular welding channels by laser welding.

Thus, in the cooling device with the easy-to-weld structure according to the present invention, since at least one of the two boards is thinner at the annular welding channel to form the easy-to-weld structure, the laser beam can penetrate the board more easily during the laser welding. Thus, the time required for forming a weld pool from the material at the interconnection of the two boards is shorter than that at other portions that are thicker, and the overall energy consumed by the laser welding is reduced, improving the laser welding efficiency and reducing the laser welding costs.

In an example, the chamber has a capillary structure. Thus, the gas-fluid phase change efficiency of the working fluid can be improved.

In an example, the outer face of each of the two boards has the annular welding channel Thus, laser welding can be easily conducted on both sides of the cooling device with the easy-to-weld structure, increasing the welding convenience.

In an example, the annular welding channels of the two boards are misaligned from each other. Thus, deformation or damage to the annular welding channels can be avoided, improving the welding quality.

In an example, the annular welding channels of the two boards are aligned with each other. Thus, laser welding can be conducted on the same location on any side without realigning the relative position of the laser head and the workpiece, improving the processing efficiency.

In an example, at least one of the two boards includes a plurality of supporting posts located in the chamber, and each of the plurality of supporting posts includes a dimple at the outer face of an associated one of the two boards. Thus, the thickness at each dimple can be reduced to form an easy-to-weld structure, improving the laser welding efficiency and reducing the energy consumption.

In an example, the cooling device with the easy-to-weld structure further includes a pump configured to drive the working fluid to circulate in the chamber. Thus, the cooling device with the easy-to-weld structure can form a liquid cooling module, proving better application.

In an example, at least one of the two boards includes a plurality of partitioning ribs located in the first chamber or the second chamber. Each two adjacent partitioning ribs have a fluid passage therebetween. Each of the plurality of partitioning ribs includes a groove having an opening at the outer face of an associated one of the two boards. Thus, the thickness at each groove can be reduced to form an easy-to-weld structure, improving the laser welding efficiency and reducing the energy consumption.

In an example, at least one of the two boards includes a plurality of supporting posts located in the first chamber or the second chamber. Each of the plurality of supporting posts includes a dimple at the outer face of an associated one of the two boards. Thus, the thickness at each dimple can be reduced to form an easy-to-weld structure, improving the laser welding efficiency and reducing the energy consumption.

In an example, the partitioning board includes a sink filled with a phase-change fluid. The sink is sealed by a cover and neither intercommunicates with the first chamber nor the second chamber. Thus, the partitioning board is provided with a mechanism like a vapor chamber, improving the cooling efficiency to the heat source.

In an example, the partitioning board includes a sink having a coarse structure. Thus, the cooling efficiency to the heat source is improved.

In an example, at least one of the two boards includes a plurality of partitioning ribs located in the first chamber or the second chamber. Each two adjacent partitioning ribs have a fluid passage therebetween. A coarse structure is disposed on the partitioning board or the at least one of the two boards which includes the plurality of partitioning ribs, and the coarse structure extends across the fluid passages. Thus, the assembling convenience and the cooling efficiency to the heat source are improved.

In an example, at least one of the two boards includes a plurality of partitioning ribs located in the first chamber or the second chamber. Each two adjacent partitioning ribs have a fluid passage therebetween. At least one of the two boards includes an auxiliary cooling portion extending across the fluid passages. Thus, the cooling efficiency to the heat source is improved.

In an example, the auxiliary cooling portion includes a wall protruding in the first chamber or the second chamber. The wall includes a recess in an outer side of a respective one of the two boards. The recess is filled with a phase-change fluid and is sealed by a lid. The recess neither intercommunicates with the first chamber nor the second chamber. Thus, the board is provided with a mechanism like a vapor chamber, improving the cooling efficiency to the heat source.

In an example, the auxiliary cooling portion includes a lid body coupled to a face of a respective one of the two boards facing the partitioning board. The lid body defines a phase-change chamber filled with a phase-change fluid. The phase-change chamber neither intercommunicates with the first chamber nor the second chamber. Thus, the board is provided with a mechanism like a vapor chamber, improving the cooling efficiency to the heat source.

In an example, the annular welding channel is formed on the respective one of the two boards by etching. Thus, the formation yield is increased, and thinning is attainable.

In an example, the annular welding channel includes two sidewalls opposite to each other. The two sidewalls are connected to the channel bottom face. Thus, the laser welding convenience is increased.

In an example, the inner face of the respective one of the two boards and the channel bottom face are connected to a lateral face of the respective one of the two boards. Thus, the annular welding channel extends to the outer side of the board, such that the annular welding channel has a wider opening for easy formation, increasing the formation convenience and efficiency.

In an example, the working fluid is an electrically non-conductive liquid. Thus, the stator of the pump does not require additional waterproof structure, which simplifies the cooling device with the easy-to-weld structure, increasing the manufacturing convenience.

BRIEF DESCRIPTION OF THE DRAWINGS

The present invention will become more fully understood from the detailed description given hereinafter and the accompanying drawings which are given by way of illustration only, and thus are not limitative of the present invention, and wherein:

FIG. 13 is a cross sectional view taken along section line 13-13 of FIG. 12.

FIG. 14 is a cross sectional view similar to FIG. 13, illustrating a cooling device with an easy-to-weld structure having annular welding channels of another type.

FIG. 19 is a cross sectional view taken along section line 19-19 of FIG. 18.

FIG. 20 is a cross sectional view similar to FIG. 15, illustrating a coarse structure connected to a second board.

Figure 1:
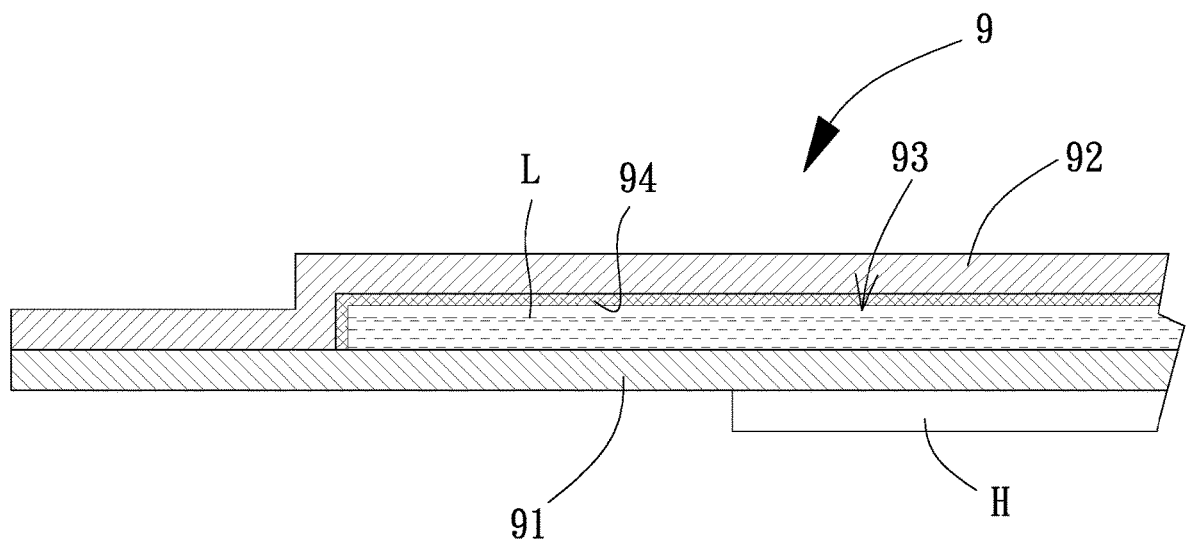
FIG. 1 is an enlarged cross sectional view of a conventional cooling device.

In the various figures of the drawings, the same numerals designate the same or similar parts. Furthermore, when the terms "front", "rear", "left", "right", "up", "down", "top", "bottom", "inner", "outer", "side" and similar terms are used hereinafter, it should be understood that these terms have reference only to the structure shown in the drawings as it would appear to a person viewing the drawings, and are utilized only to facilitate describing the invention, rather than restricting the invention.

DETAILED DESCRIPTION OF THE INVENTION

Figure 2:
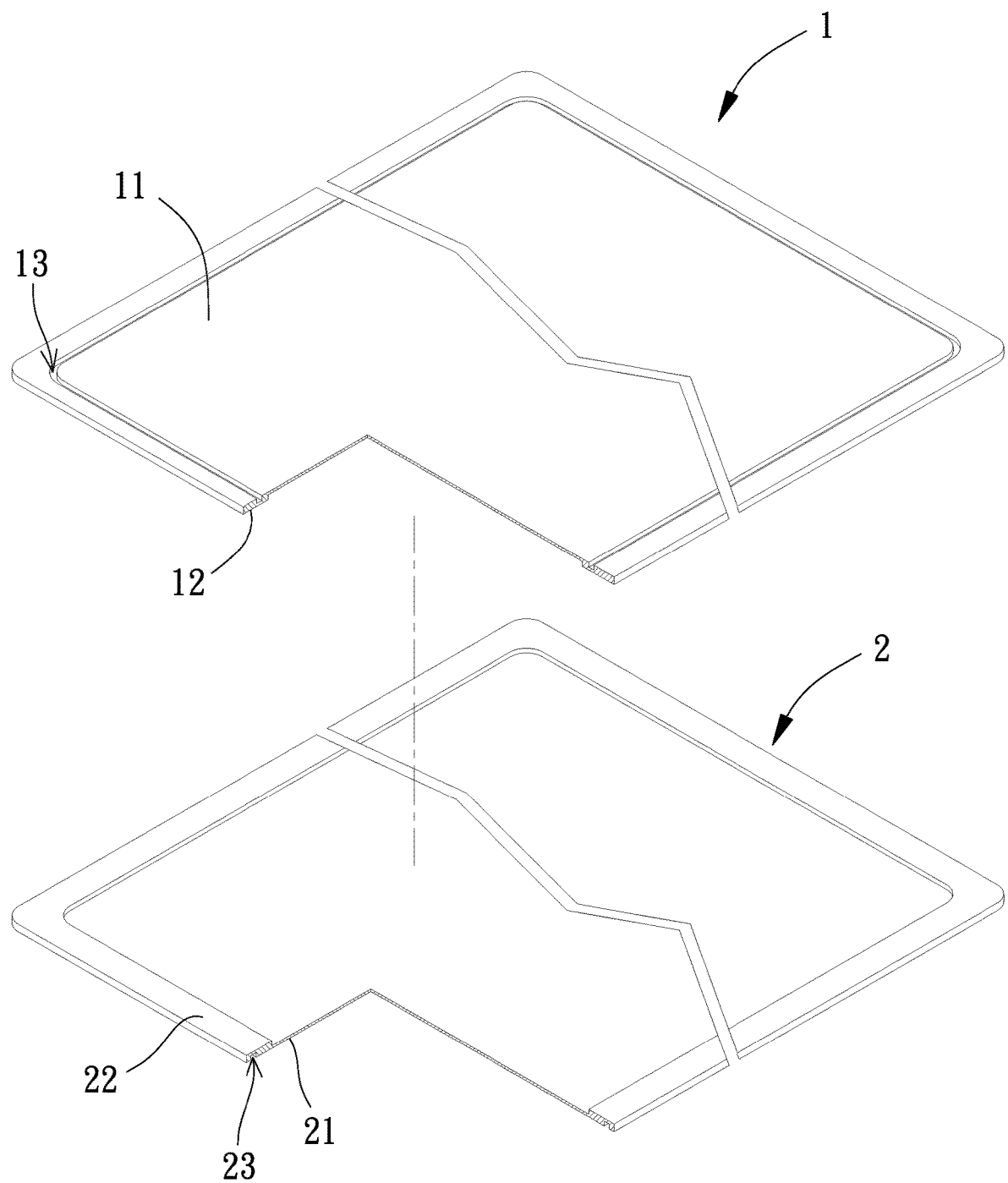
FIG. 2 is an exploded, partially-cutaway, perspective view of a cooling device of a first embodiment according to the present invention.

With reference to FIG. 2, a cooling device with an easy-to-weld structure of a first embodiment according to the present invention includes two boards coupled to each other. For ease of explanation, the two boards are referred to as "a first board 1" and "a second board 2", respectively. Nevertheless, the first board 1 and the second board 2 of the present invention shall not be limited to the relative position shown in the figures. Namely, although the upper board in the figures of this embodiment is designated as the first board 1 and the other board is designated as the second board 2, the upper board can be referred to as the second board 2 while the other board can be referred to as the first board 1, which can be appreciated by one having ordinary skill in the art.

Each of the first board 1 and the second board 2 can be made of copper, aluminum, titanium, stainless steel, or other thermally conductive materials. The materials of the first board 1 and the second board 2 can be identical or different. The first board 1 includes a first outer face 11 and a first inner face 12 opposite to the first outer face 11. The second board 2 includes a second outer face 21 and a second inner face 22 opposite to the second outer face 21. The second inner face 22 faces the first inner face 12 for easily abutting each other.

Figure 3:
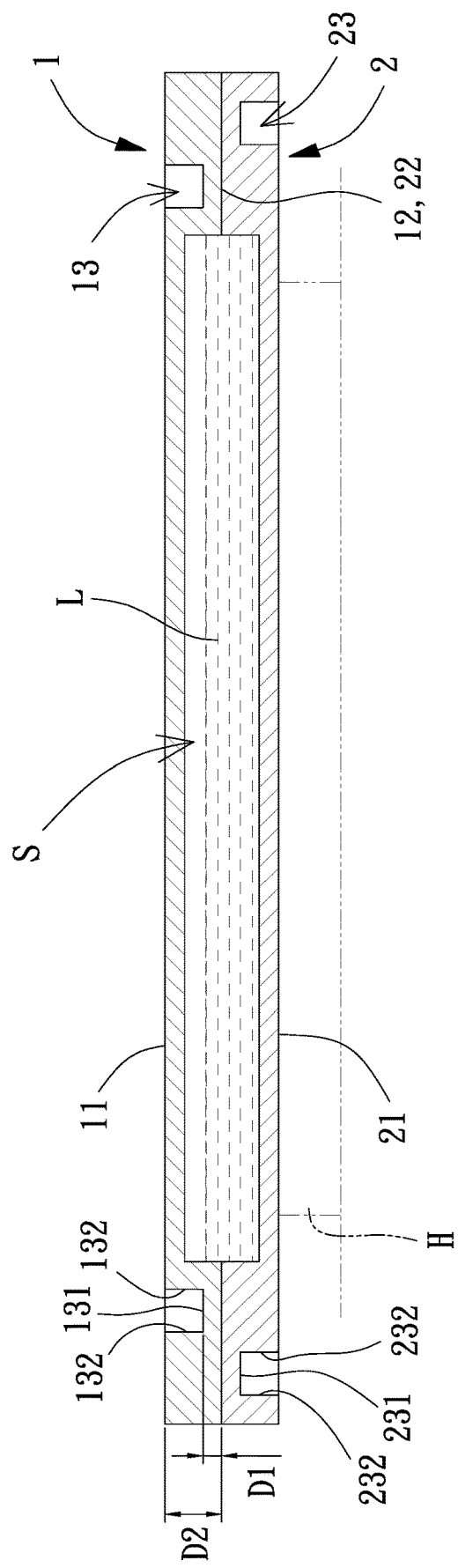
FIG. 3 is a cross sectional view of the cooling device of the first embodiment according to the present invention.

With reference to FIGS. 2 and 3, the forms of the first and second boards 1 and 2 are not limited in the present invention as along as the two boards 1 and 2 together define a chamber S therebetween for receiving a working fluid L after the first and second boards 1 and 2 are coupled together. The working fluid L can be, but not limited to, an electrically non-conductive liquid. In an example, a portion of each of the first board 1 and the second board 2 can be recessed from the inside to reduce the board thickness, thereby forming a cavity and an annular wall surrounding the cavity. The first inner face 12 of the first board 1 is an inner face of the annular wall of the first board 1, and the second inner face 22 of the second board 2 is an inner face of the annular wall of the second board 2. Namely, the first inner face 12 does not include the cavity of the first board 1, and the second inner face 22 does not include the cavity of the second board 2. Thus, the first inner face 12 of the first board 1 and the second inner face 22 of the second board 2 surround these two cavities, respectively. Furthermore, after the first inner face 12 and the second inner face 22 abut each other, these two cavities together define the chamber S. In a case that each of the first board 1 and the second board 2 has an extremely small thickness, these two cavities can be formed by etching. In another case that each of the first board 1 and the second board 2 has a relatively larger thickness, these two cavities can be formed by milling.

Furthermore, the first board 1 can include an annular welding channel 13 on the first outer face 11 thereof. The annular welding channel 13 surrounds the chamber S and can be formed by removing material, such that the thickness of the first board 1 at the annular welding channel 13 is thinner than a portion of the first board 1 adjacent to the annular welding channel 13, forming an easy-to-weld structure. Namely, in the present invention, an annular groove is formed on an outer face of a board without changing the board thickness, excluding pressing and similar methods which deform the board.

More specifically, the annular welding channel 13 of this embodiment can be formed by etching or milling, depending on the thickness of the first board 1. The annular welding channel 13 does not extend through the first board 1 to reach the first inner face 12, and the annular welding channel 13 has a channel bottom face 131. The smallest distance D1 between the channel bottom face 131 and the first inner face 12 is smaller than the smallest distance D2 between the first outer face 11 and the first inner face 12. The form of the annular welding channel 13 is not limited in the present invention as long as a portion of the first board 1 is reduced in thickness to form the easy-to-weld structure. In this embodiment, the annular welding channel 13 is an annular channel recessed from the first outer face 11, such that the annular welding channel 13 have sidewalls 132 opposite to each other. The two sidewalls 132 are directly or indirectly connected to the channel bottom face 131. The channel bottom face 131 can be a planar face, an inclined face, an arcuate face or a combination thereof. The channel bottom face 131 is not limited to the form shown in the figures of this embodiment.

During assembly of the cooling device with the easy-to-weld structure, the first board 1 and the second board 2 are coupled together along the annular welding channel 13 through laser welding, providing secure coupling between the first inner face 12 of the first board 1 and the second inner face 22 of the second board 2. Since the first board 1 is thinner at the annular welding channel 13 to form the easy-to-weld structure, the laser beam can penetrate the first board 1 more easily during the laser welding from the first board side. Thus, the time required for forming a weld pool from the material at the interconnection of the first board 1 and the second board 2 is shorter than that at other portions that are thicker, improving the laser welding efficiency. Furthermore, the overall energy consumed by the laser welding can be reduced, lowering the manufacturing costs for laser welding.

Likewise, the second outer face 21 of the second board 2 can include an annular welding channel 23 having a channel bottom face 231 and two sidewalls 232 directly or indirectly connected to the channel bottom face 231. The annual welding channel 23 surrounds the chamber S, such that the above-mentioned effect can be achieved when conducting the laser welding from the second board side. Thus, laser welding can be easily conducted from either side of the cooling device with the easy-to-weld structure. As shown in FIG. 3, these two annular welding channels 13 and 23 can be misaligned from each other to avoid deformation or damage to the annular welding channel 23 (or the annular welding channel 13) when conducting laser welding along the annular welding channel 13 (or the annular welding channel 23).

After the cooling device with the easy-to-weld structure is assembled, the first board 1 or the second board 2 can be thermally connected to a heat source H of an electronic device, such as by direct contact or through a thermally conductive material like a thermal pad. In an example of thermal contact with the heat source H by the second board 2, the first board 1 can be connected to a fin member, or a cooling fan can be used to drive air currents to flow through the first board 1, such that the temperature of the first board 1 is lower than that of the second board 2. Thus, when the temperature of the heat source H increases during operation of the electronic device, the second board 2 absorbs the heat of the heat source H, such that the working fluid L (in the liquid phase) in the chamber S absorbs the heat and vaporizes. When the working fluid L in the gaseous phase contacts the first board 1 of a lower temperature, the working fluid L in the gaseous phase releases heat, lowers its temperature, and condenses into the liquid phase. Thus, the cooling device with the easy-to-weld structure can continuously undergo the gas-liquid phase change of the working fluid L to effectively carry the heat of the heat source H away. This assists in cooling of the heat source H to maintain at a suitable working temperature, avoiding overheating that affects the performances of the electronic device.

Figure 4:
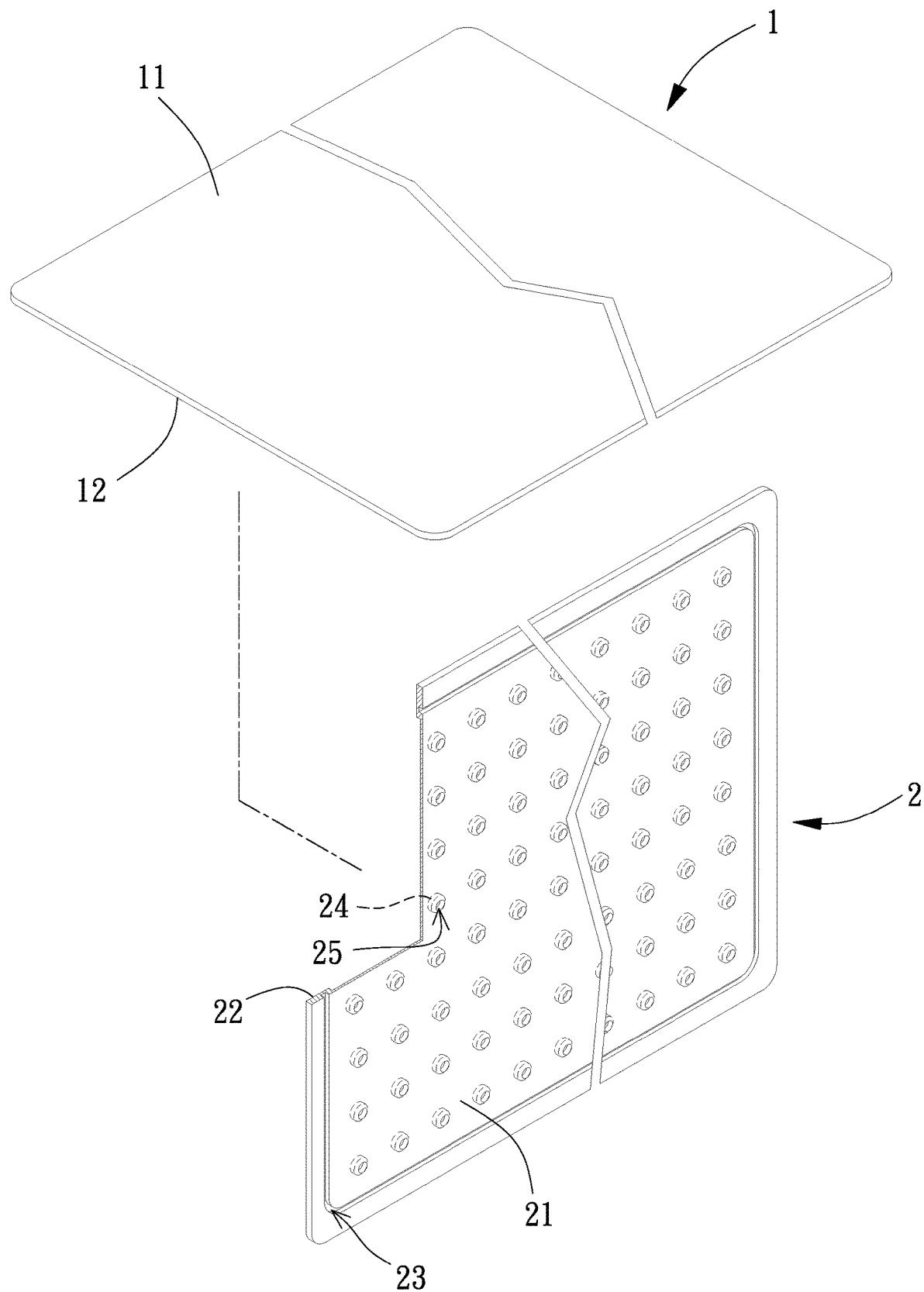
FIG. 4 is an exploded, partially-cutaway, perspective view of a cooling device of a second embodiment according to the present invention.
Figure 5:
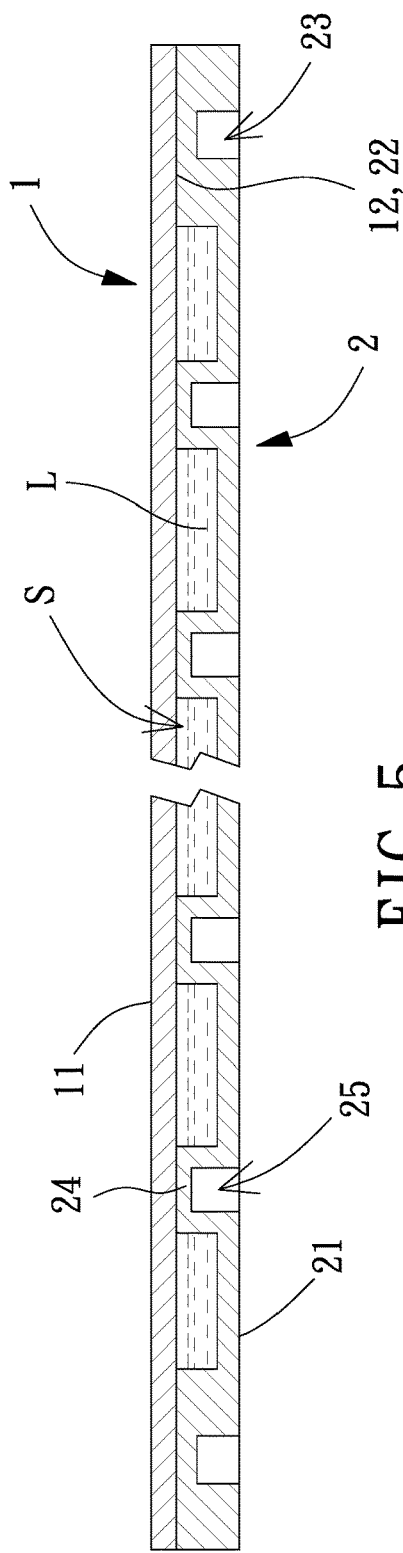
FIG. 5 is a cross sectional view of the cooling device of the second embodiment according to the present invention.

FIGS. 4 and 5 show a cooling device with an easy-to-weld structure of a second embodiment according to the present invention. The second board 2 in this embodiment is similar to that in the first embodiment and has the annular welding channel 23. Furthermore, the first board 1 is a thinner flat board, which is helpful in reducing the overall thickness of the cooling device with the easy-to-weld structure.

Furthermore, in addition to coupling the first board 1 and the second board 2 along the annular welding channel 23 of the second board 2 through laser welding, the second board 2 can include a plurality of supporting posts 24 located in the chamber S. The height of each of the plurality of supporting posts 24 is approximately the same as the depth of the chamber S, such that the plurality of supporting posts 24 abuts the first board 1 to provide an auxiliary supporting effect, which is helpful in maintaining the volume of the chamber S, avoiding partial deformation of the cooling device with the easy-to-weld structure. Moreover, each of the plurality of supporting posts 24 can include a dimple 25 at the second outer face 21 of the second board 2. The dimples 25 can be formed by removing material, such that the thickness of the second board 2 at each dimple 25 is thinned in comparison with the form of the second boards 2 without the dimples 25, forming the easy-to-weld structure. Thus, during assembly of the cooling device with the easy-to-weld structure, the second board 2 can be coupled to the first board 1 by each dimple 25 through laser welding. This shortens the time of the laser welding procedure and reduces the consumed energy. Likewise, as in the first embodiment, each of the first board 1 and the second board 2 can include a plurality of supporting posts. The plurality of supporting posts on the first board 1 can abut the plurality of supporting posts 24 on the second board 2, and laser welding can be conducted on the plurality of supporting posts of the first board 1 and the supporting post 24 of the second board 2.

Figure 6:
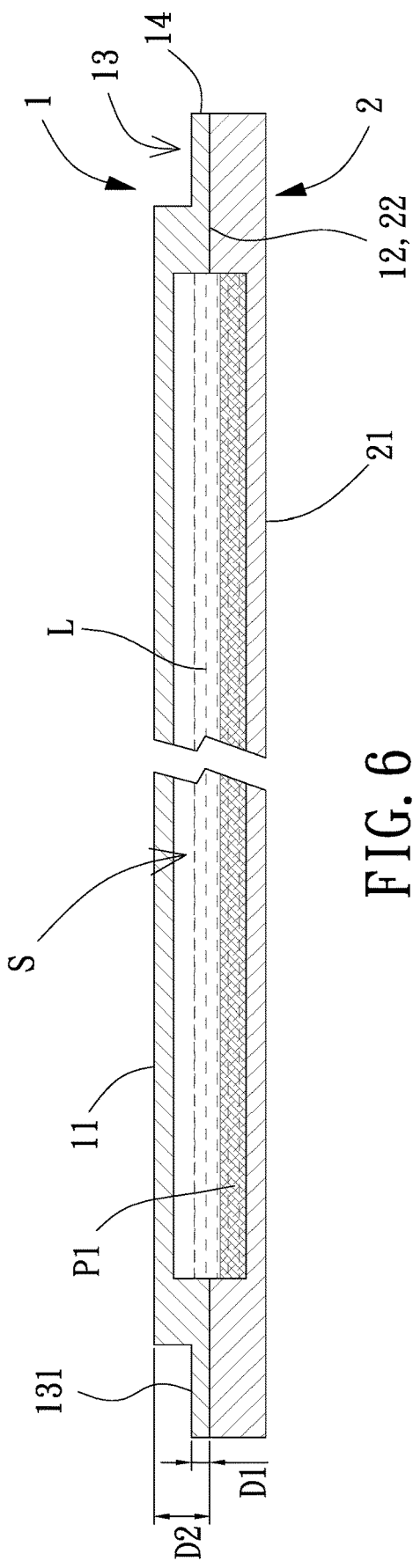
FIG. 6 is a cross sectional view of the cooling device of a third embodiment according to the present invention.

FIG. 6 shows a cooling device with an easy-to-weld structure of a third embodiment according to the present invention. In this embodiment, an annular welding channel 13 is formed on the first board 1. The first board 1 includes a lateral face 14 located between edges of the first outer face 11 and the first inner face 12 of the first board 1. The lateral face 14 is connected between the first inner face 12 and a channel bottom face 131 of the annular welding channel 13. Namely, the annular welding channel 13 extends to an outer side of the first board 1, such that the annular welding channel 13 has a larger opening for easy formation. The smallest distance D1 between the channel bottom face 131 and the first inner face 12 is smaller than the smallest distance D2 between the first outer face 11 and the first inner face 12. Furthermore, the chamber S can further include a capillary structure P1 to assist in the efficiency of the gas-liquid phase change of the working fluid L. Likewise, similar structure of this embodiment can be formed on the second board 2 or both the first board 1 and the second board 2.

It is worth mentioning that the cooling device with the easy-to-weld structure of each of the first, second, and third embodiments can be a vapor chamber (VC), a flat heat pipe (FHP), or a device with a similar function. At least one of the first board 1 and the second board 2 can include an annular welding channel 13, 23. In a case that both the first board 1 and the second board 2 include an annular welding channel 13, 23, the annular welding channels 13 and 23 can be identical or different in the forms, which can be appreciated by one having ordinary skill in the art and, is, thus, not limited to the forms illustrated in various figures.

Figure 7:
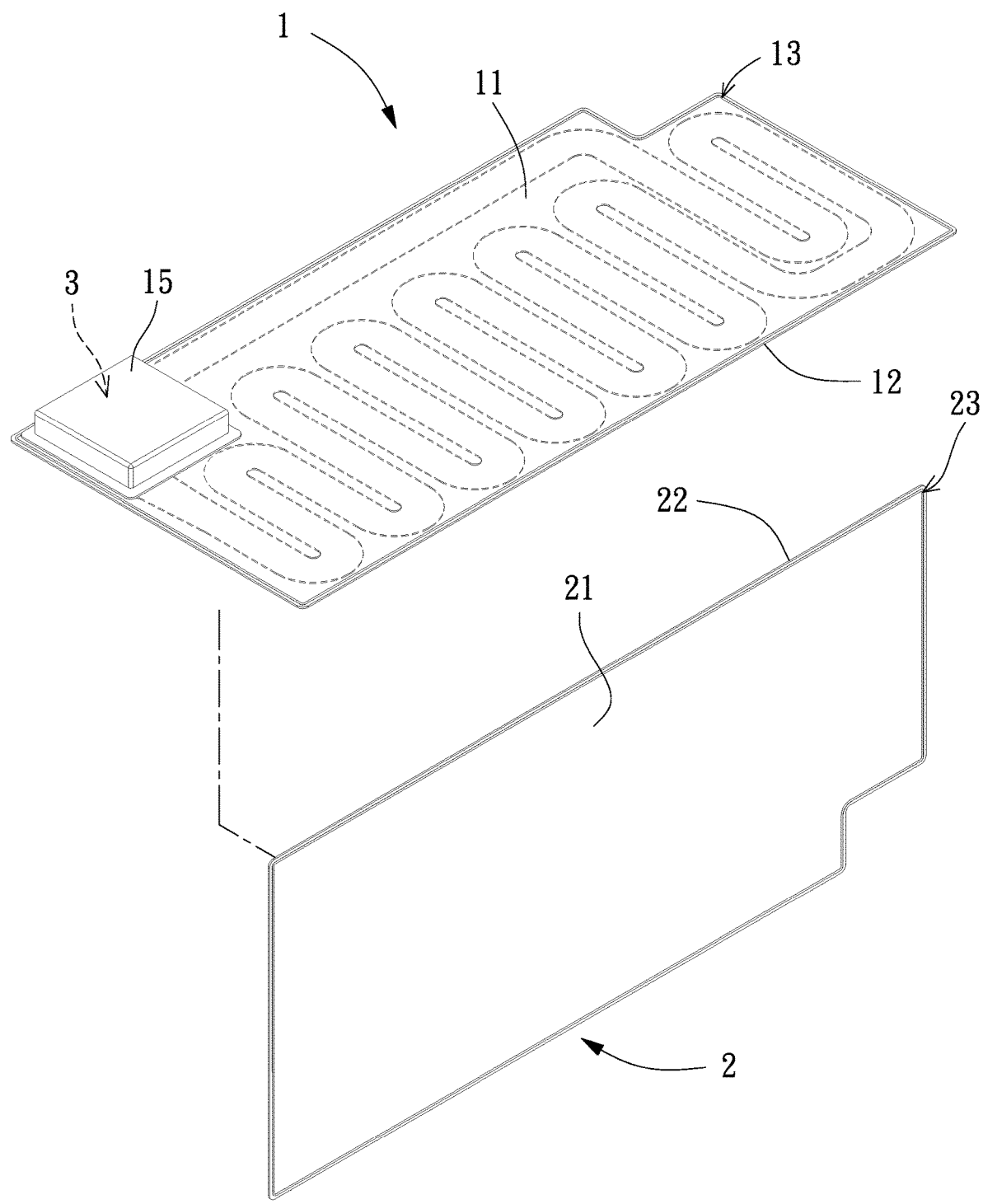
FIG. 7 is an exploded, perspective view of a cooling device of a fourth embodiment according to the present invention.
Figure 8:
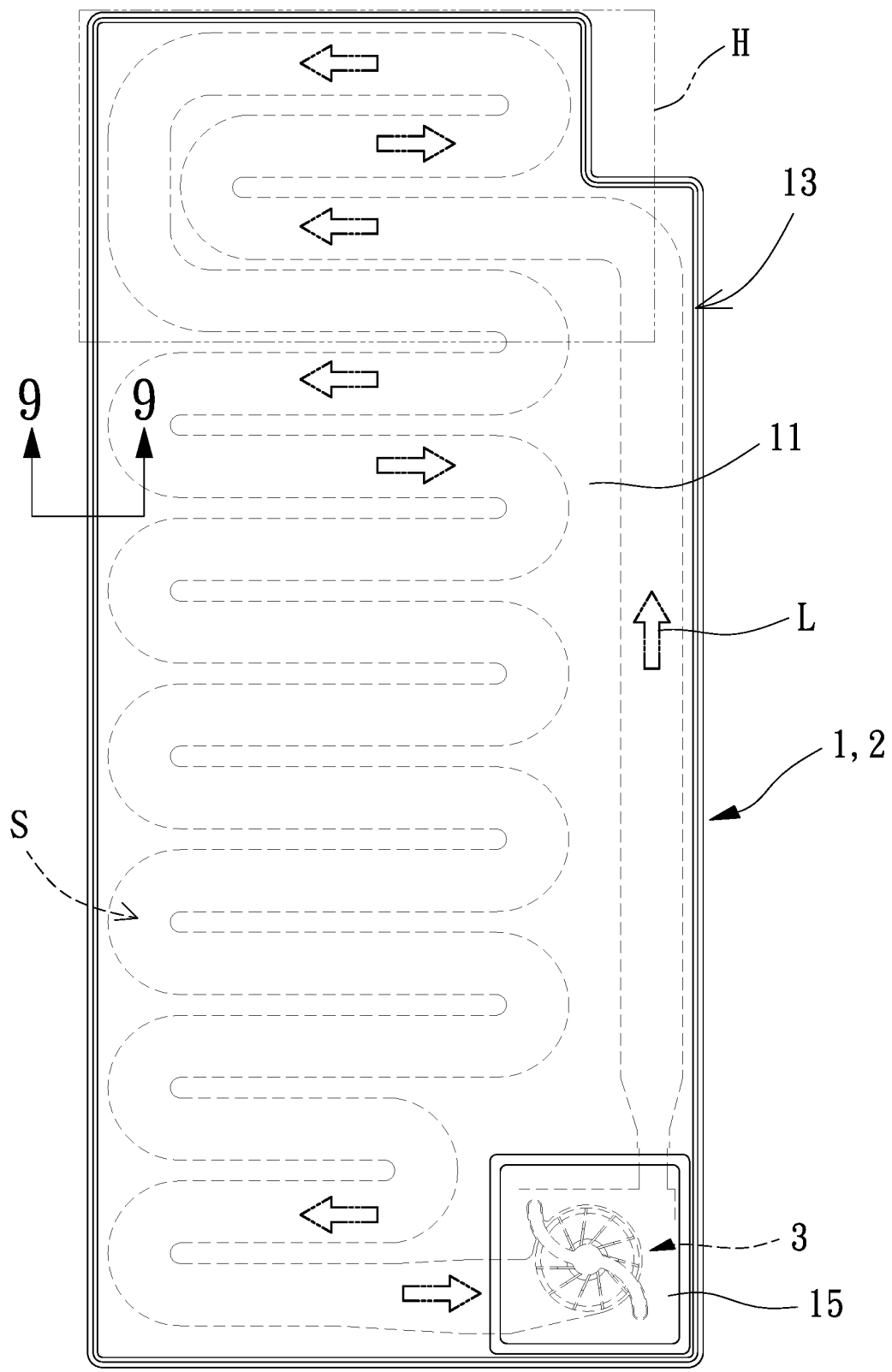
FIG. 8 is a front elevational view of the cooling device of the fourth embodiment according to the present invention after assembly.

FIGS. 7 and 8 show a cooling device with an easy-to-weld structure of a fourth embodiment according to the present invention. In this embodiment, the cooling device with the easy-to-weld structure can be a liquid cooling module. The first board 1 and the second board 2 are coupled to each other by laser welding, and have a chamber S therebetween. A pump 3 is provided to drive the working fluid L to circulate in the chamber S.

More specifically, the cavity for forming the chamber S can be located on an inner side of the first board 1 and/or an inner side of the second board 2. In this embodiment, the chamber S can form a winding fluid passage, and the pump 3 can drive the working fluid L to flow from a leading end towards a tail end of the fluid passage and to circulate continuously. This embodiment may further include a protrusion 15 on the first board 1. The protrusion 15 has an interior in which at least a portion of the pump 3 is received. The protrusion 15 can be integrally formed with the other portion of the first board 1 to avoid leakage of fluid. For example, the protrusion 15 can be formed by pressing. Alternatively, the first board 1 can include a through-hole, and a cover is coupled to the first outer face 11 of the first board 1 and is aligned with the through-hole, such that the cover forms the protrusion 15 of the first board 1. However, the present invention is not limited in this regard.

Figure 9:
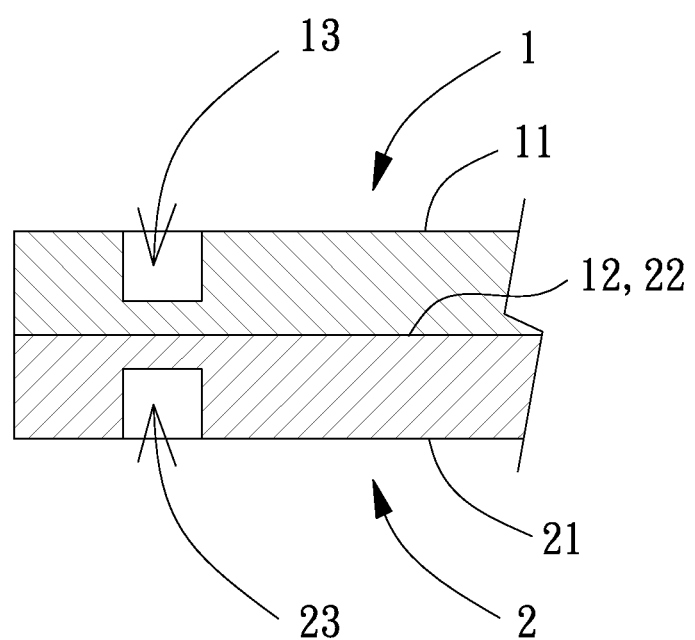
FIG. 9 is a cross sectional view taken along section line 9-9 of FIG. 8.

With reference to FIG. 9, in this embodiment, at least one of the first board 1 and the second board 2 includes the annular welding channel 13, 23. In a case that both the first board 1 and the second board 2 include the annular welding channel 13, 23, the annular welding channels 13 and 23 can be identical or different in the forms and can be aligned with or misaligned from each other, which can be appreciated by one having ordinary skill in the art and, is, thus, not limited to the forms illustrated in various figures. In a case that the annular welding channel 13 of the first board 1 and the annular welding channel 23 of the second board 2 are aligned with each other, laser welding can be conducted at the same location on any side of the cooling device with the easy-to-weld structure without realigning the relative position of the laser head and the workpiece.

With reference to FIG. 8, after the cooling device with the easy-to-weld structure is assembled, the first board 1 or the second board 2 can be partially and thermally connected to a heat source H of an electronic device, such as by direct contact or through a thermally conductive material like a thermal pad. In an example of thermal contact with the heat source H by a portion of the second board 2, a fin member can be connected to a part of the first board 1 or a part of the second board 2 that is distant to the heat source H, or a cooling fan can be used to drive air currents to flow away from the heat source H, such that the temperature of a position distant to the heat source H is lower than that of another position adjacent to the heat source H. Thus, when the temperature of the heat source H increases, a portion of the second board 2 absorbs the heat of the heat source H, such that the working fluid L flowing near the heat source H absorbs the heat and the temperature of the working fluid L rises. Then, after flowing away from the heat source H, the working fluid L contacts another portion of the board of a lower temperature to release the heat and to lower the temperature. Next, the working fluid L flows back into the pump 3 for another circulation. Thus, the planar circulation of the liquid cooling module can effectively carry away the heat of the heat source H. This assists in cooling of the heat source H to maintain at a suitable working temperature, avoiding overheating that affects the performances of the electronic device.

Figure 10:
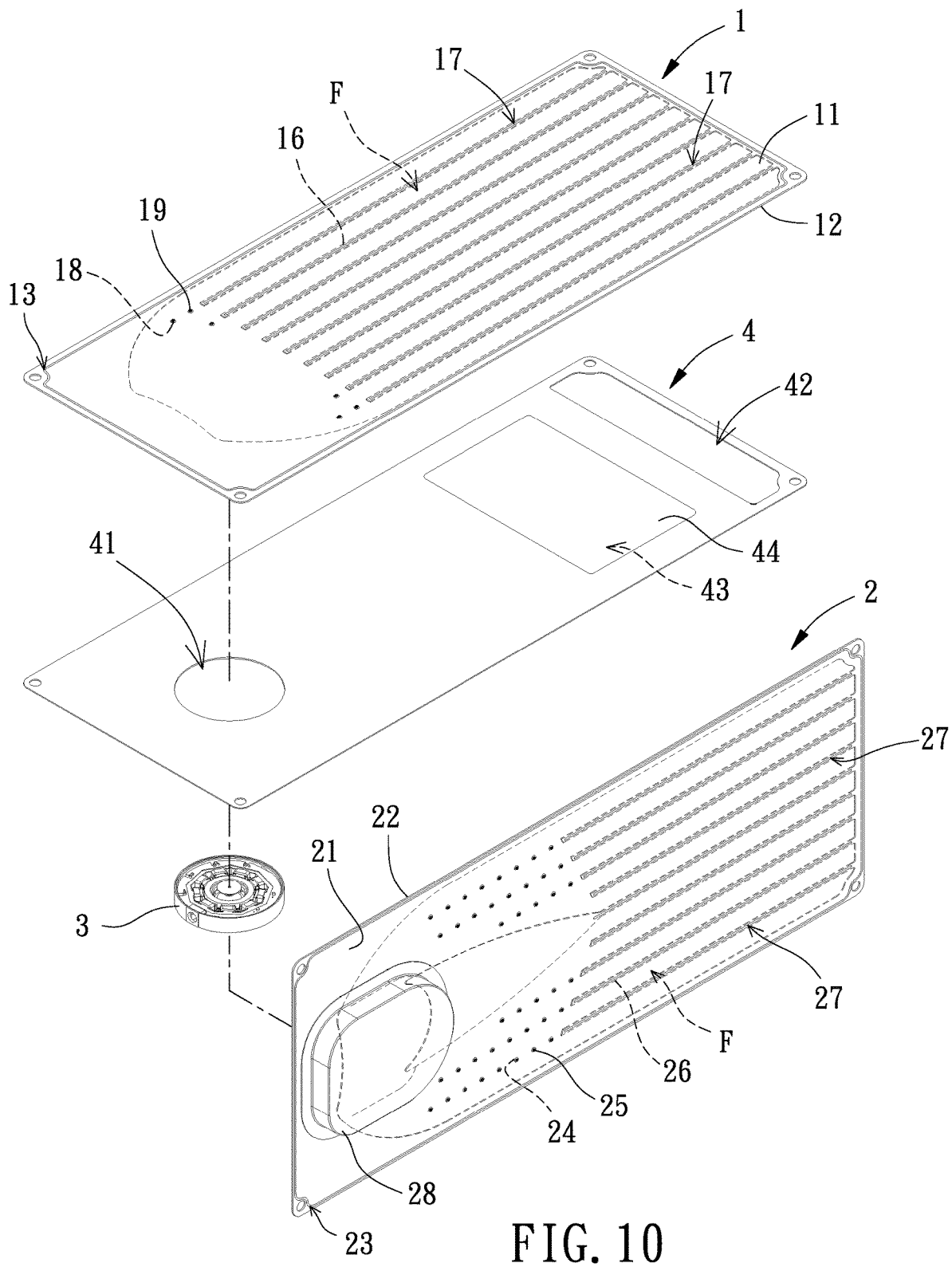
FIG. 10 is an exploded, perspective view of a cooling device of a fifth embodiment according to the present invention.

FIGS. 10 and 13 show a cooling device with an easy-to-weld structure of a fifth embodiment according to the present invention. In this embodiment, the cooling device with the easy-to-weld structure can be a liquid cooling module and includes a partitioning board 4 disposed between the first board 1 and the second board 2. Thus, the partitioning board 4 separates an interior of the liquid cooling module into a first chamber S1 and a second chamber S2. In this embodiment, the first chamber S1 is defined between the first board 1 and the partitioning board 4, and the second chamber S2 is defined between the second board 2 and the partitioning board 4. The partitioning board 4 further includes an intercommunication port 41 and a backflow port 42. The first chamber S1 and the second chamber S2 are spaced from each other in an axial direction and intercommunicate with each other via the intercommunication port 41 and the backflow port 42. A pump 3 is used to drive a working fluid L1 to circulate in the first chamber S1 and the second chamber S2. The working fluid L1 can be an electrically non-conductive liquid. A stator of the pump 3 does not require additional waterproof structure.

More specifically, the first inner face 12 of the first board 1 and the second inner face 22 of the second board 2 face the partitioning board 4. In this embodiment, a portion of each of the first board 1 and the second board 2 can be recessed from the inside to reduce the board thickness partially, thereby forming a cavity on each of the first board 1 and the second board 2. Thus, the first inner face 12 of the first board 1 surrounds the cavity of the first board 1, and the second inner face 22 of the second board 2 surrounds the cavity of the second board 2. After the first inner face 12 and the second inner face 22 abut the partitioning board 4, the cavity of the first board 1 and the partitioning board 4 together define the first chamber S1, and the cavity of the second board 2 and the partitioning board 4 together define the second chamber S2. In a case that each of the first board 1 and the second board 2 has an extremely small thickness, these two cavities can be formed by etching. In another case that each of the first board 1 and the second board 2 has a relatively larger thickness, these two cavities can be formed by milling.

Figure 11:
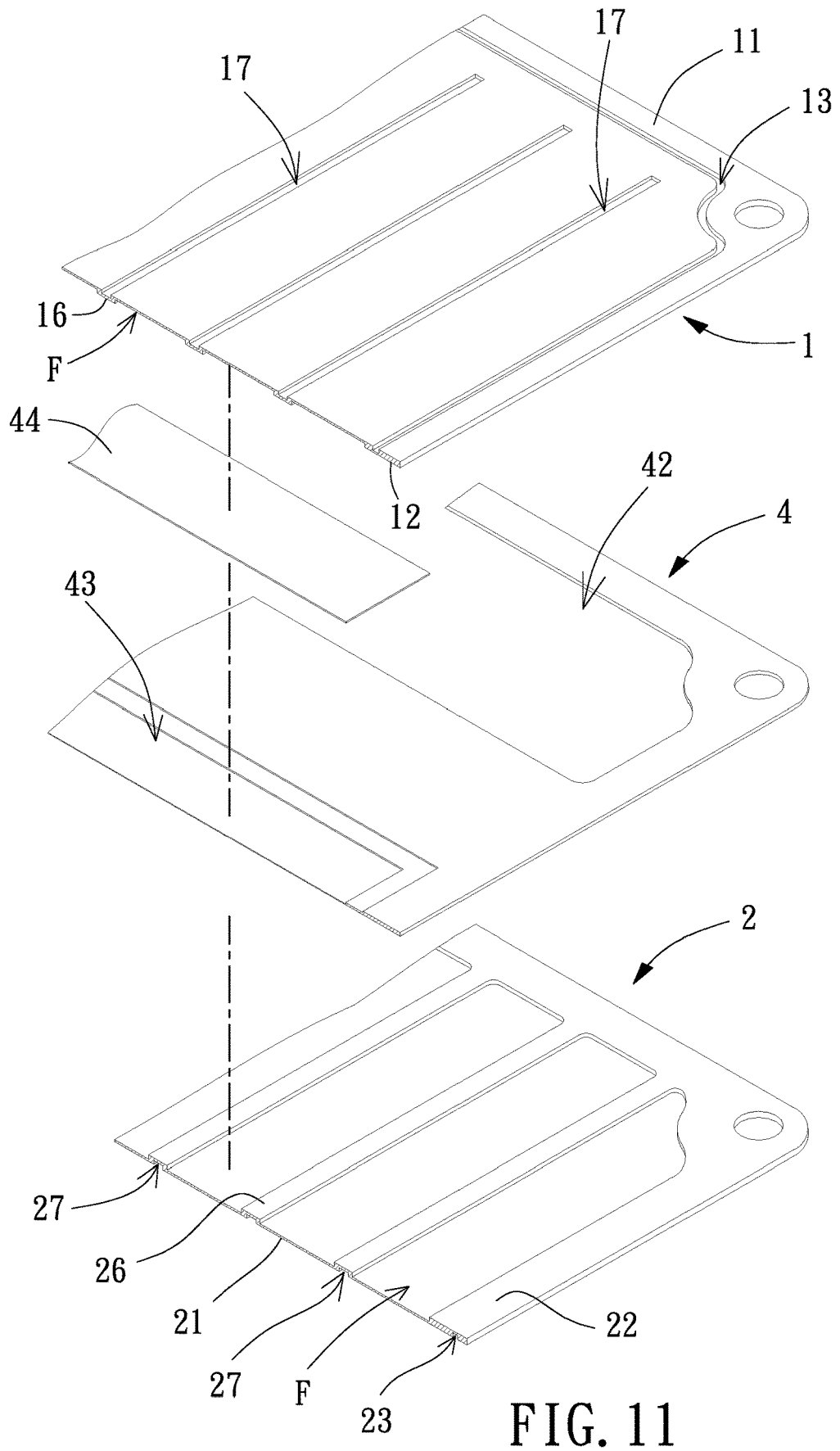
FIG. 11 is an exploded, partially-cutaway, perspective view of a first board, a second board, and a partitioning board of the cooling device of the fifth embodiment according to the present invention.

With reference to FIGS. 11 and 13, the first outer face 11 of the first board 1 can include an annular welding channel 13. The annular welding channel 13 surrounds the first chamber S1 and can be formed by removing material, such that the thickness of the first board 1 at the annular welding channel 13 is thinner than the portion of the first board 1 adjacent to the annular welding channel 13, forming an easy-to-weld structure. Likewise, the second outer face 21 of the second board 2 can include an annular welding channel 23. The annular welding channel 23 surrounds the second chamber S2 and can be formed by removing material, such that the thickness of the second board 2 at the annular welding channel 23 is thinner than the portion of the second board 2 adjacent to the annular welding channel 23, forming an easy-to-weld structure. Thus, during assembly of the cooling device with the easy-to-weld structure, the first board 1 can be coupled to the partitioning board 4 along the annular welding channel 13 by laser welding, and the second board 2 can be coupled to the partitioning board 4 along the annular welding channel 23 by laser welding. These two annular welding channels 13 and 23 can shorten the time of the laser welding procedure and can reduce the consumed energy.

In addition, the two annular welding channels 13 and 23 can be annular channels recessed from the first outer face 11 and the second outer face 21, as shown in FIG. 13. Alternatively, as shown in FIG. 14, the two annular welding channels 13 and 23 can extend to the outer side of the first board 1 and the outer side of the second board 2, respectively. In other words, the second inner face 22 and the channel bottom face 231 of the annular welding channel 23 can also be connected to a lateral face 2a of the second board 2. Alternatively, each of the two annular welding channels 13 and 23 can be one of the forms mentioned above, as shown in FIG. 19. However, the present invention is not limited in this regard.

With reference to FIGS. 10 and 13 again, the first board 1 further includes a plurality of partitioning ribs 16 located in the first chamber S1 and substantially parallel to each other, and the second board 2 includes a plurality of plurality of ribs 26 located in the second chamber S2 and substantially parallel to each other. Each of the plurality of partitioning ribs 16 extends in an direction of the intercommunication port 41 connecting to the backflow port 42 (i.e., the flowing direction of the working fluid L1), forming a fluid passage F between two adjacent partitioning ribs 16, thereby assisting in guiding the working fluid L1 to flow more uniformly and more smoothly in the first chamber S1. Each of the plurality of partitioning ribs 26 extends in the direction of the intercommunication port 41 connecting to the backflow port 42 (i.e., the flowing direction of the working fluid L1), forming a fluid passage F between two adjacent partitioning ribs 26, thereby assisting in guiding the working fluid L1 to flow more uniformly and more smoothly in the second chamber S2. Each of the plurality of partitioning ribs 16 does not extend to a location of the first chamber S1 aligned with the intercommunication port 41, permitting the working fluid L1 to accumulate in another location adjacent to the intercommunication port 41, thereby passing through the intercommunication port 41 more smoothly. Likewise, each of the plurality of partitioning ribs 26 does not extend to a location of the second chamber S2 aligned with the intercommunication port 41, permitting the working fluid L1 to accumulate in another location adjacent to the intercommunication port 41, thereby passing through the intercommunication port 41 more smoothly. Furthermore, each of the plurality of partitioning ribs 16 includes a groove 17 having an opening at the first outer face 11 of the first board 1. Each of the plurality of partitioning ribs 26 includes a groove 27 having an opening at the second outer face 21 of the second board 2. The grooves 17 and 27 can be formed by removing material, such that the thicknesses of the first board 1 and the second board 2 at the grooves 17 and 27 can be smaller (than the forms without the grooves 17 and 27), forming an easy-to-weld structure. Thus, during assembly of the cooling device with the easy-to-weld structure, the second board 2 can be coupled to the first board 1 by laser welding the grooves 17 and 27. The grooves 17 and 27 shorten the time of the laser welding procedure and reduces the consumed energy.

Figure 12:
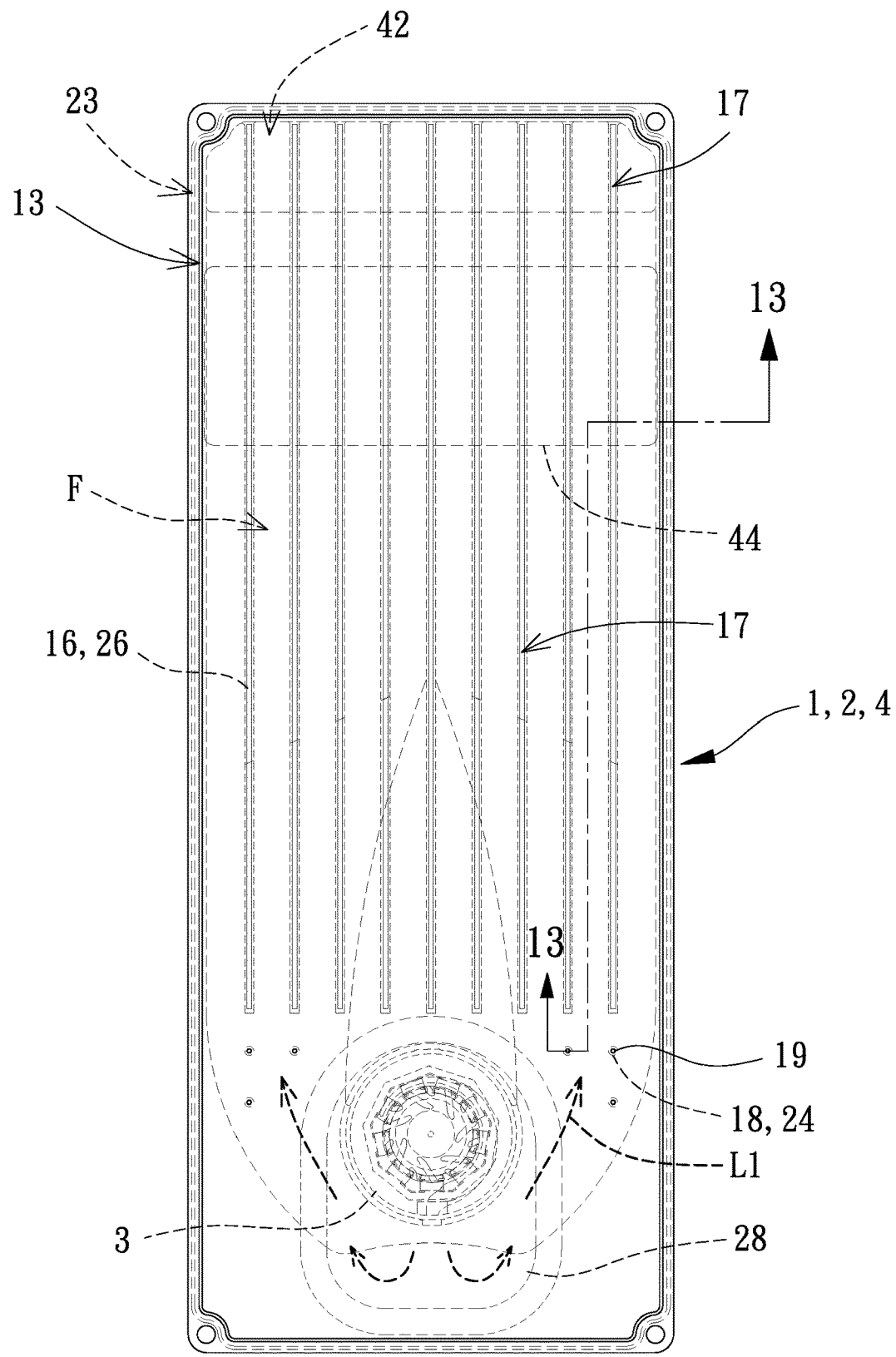
FIG. 12 is a front elevational view of the cooling device of the fifth embodiment according to the present invention after assembly.

With reference to FIGS. 12 and 13, the first board 1 further includes a plurality of supporting posts 18 located in the first chamber S1 and not located in the area having the plurality of partitioning ribs 16, and the second board 2 further includes a plurality of supporting posts 24 located in the second chamber S2 and not located in the area having the plurality of partitioning ribs 26. Each of the plurality of supporting posts 18 and the plurality of partitioning ribs 16 has a height approximately the same as the depth of the first chamber S1 (except for the portion to which the pump 3 is mounted). Each of the plurality of supporting posts 24 and the plurality of partitioning ribs 26 has a height approximately the same as the depth of the second chamber S2 (except for the portion to which the pump 3 is mounted). Thus, the plurality of supporting posts 18 and 24 and the plurality of partitioning ribs 16 and 26 can abut the partitioning board 4 to provide an auxiliary supporting effect, assisting in maintaining the volume of the first chamber S1 and the second chamber S2, thereby avoiding partial deformation of the cooling device with the easy-to-weld structure. Furthermore, each of the plurality of supporting posts 18 can have a dimple 19 at the first outer face 11 of the first board 1. The dimples 19 can be formed by removing material, such that the thickness of the first board 1 at each dimple 19 can be smaller (than the forms without the dimples 19), forming an easy-to-weld structure. Each of the plurality of supporting posts 24 includes a dimple 25 at the second outer face 21 of the second board 2. The dimples 25 can be formed by removing material, such that the thicknesses of the second board 2 at each dimple 25 can be smaller (than the forms without the dimples 25), forming an easy-to-weld structure. Thus, during assembly of the cooling device with the easy-to-weld structure, the first board 1 can be coupled to the partitioning board 4 by laser welding the dimples 19, and the second board 2 can be coupled to the partitioning board 4 by laser welding the dimples 25. The dimples 19 and 25 shorten the time of the laser welding procedure and reduces the consumed energy.

Furthermore, with reference to FIG. 10, this embodiment includes a protrusion 28 on the second board 2. The protrusion 28 has an interior in which at least a portion of the pump 3 is received. The protrusion 28 can be integrally formed with the other portion of the second board 2 to avoid leakage of fluid. For example, the protrusion 28 can be formed by pressing. Alternatively, the second board 2 can include a through-hole, and a cover is coupled to the second outer face 21 of the second board 2 and is aligned with the through-hole, such that the cover forms the protrusion 28 of the second board 2. However, the present invention is not limited in this regard.

With reference to FIGS. 11 and 13, the partitioning board 4 can be substantially a flat board or includes a sink 43 recessed from a face thereof. A phase-change fluid L2 is filled in the sink 43 and is sealed by a cover 44, such that the sink 43 neither intercommunicates with the first chamber S1 nor the second chamber S2. Namely, the phase-change fluid L2 in the sink 43 will not mix with the working fluid L1 in the first chamber S1 and the second chamber S2. The phase-change fluid L2 and the working fluid L1 can have identical or different components. Preferably, the phase-change fluid L2 is an electrically non-conductive liquid. Thus, the sink 43, the cover 44, and the phase-change fluid L2 act as a vapor chamber in the partitioning board 4. The area and location of such vapor chamber can be adjusted according to the heat source H, assisting in improving the cooling efficiency to the heat source H by the cooling device with the easy-to-weld structure.

Still referring to FIGS. 10 and 13, after the cooling device with the easy-to-weld structure is assembled, the first board 1 or the second board 2 can be thermally connected to a heat source H of an electronic device, such as by direct contact or through a thermally conductive material like a thermal pad. In an example of thermal contact with the heat source H by the second board 2, the first board 1 can be connected to a fin member, or a cooling fan can be used to drive air currents to flow through the first board 1, such that the temperature of the first board 1 is lower than that of the second board 2. Thus, when the temperature of the heat source H increases during operation of the electronic device, the second board 2 absorbs the heat of the heat source H, such that the working fluid L1 flowing through the second chamber S2 absorbs the heat and the temperature of the working fluid L1 rises. Then, when the working fluid L1 flows through the first chamber S1 and contacts with the first board 1 of a lower temperature, the working fluid L1 releases heat and lowers its temperature. Thus, the cooling device with the easy-to-weld structure can effectively carry the heat of the heat source H away by the working fluid L1 that continuously circulates in the first chamber S1 and the second chamber S2. This assists in cooling of the heat source H to maintain at a suitable working temperature, avoiding overheating that affects the performances of the electronic device. The cooling device with the easy-to-weld structure can be applied to electronic devices including, but not limited to, mobile phones, tablets, handheld game consoles, notebook computers, desktop computers, photographic equipment, smart wearable devices, AR/VR glasses, electronic medical devices, etc.

Figure 15:
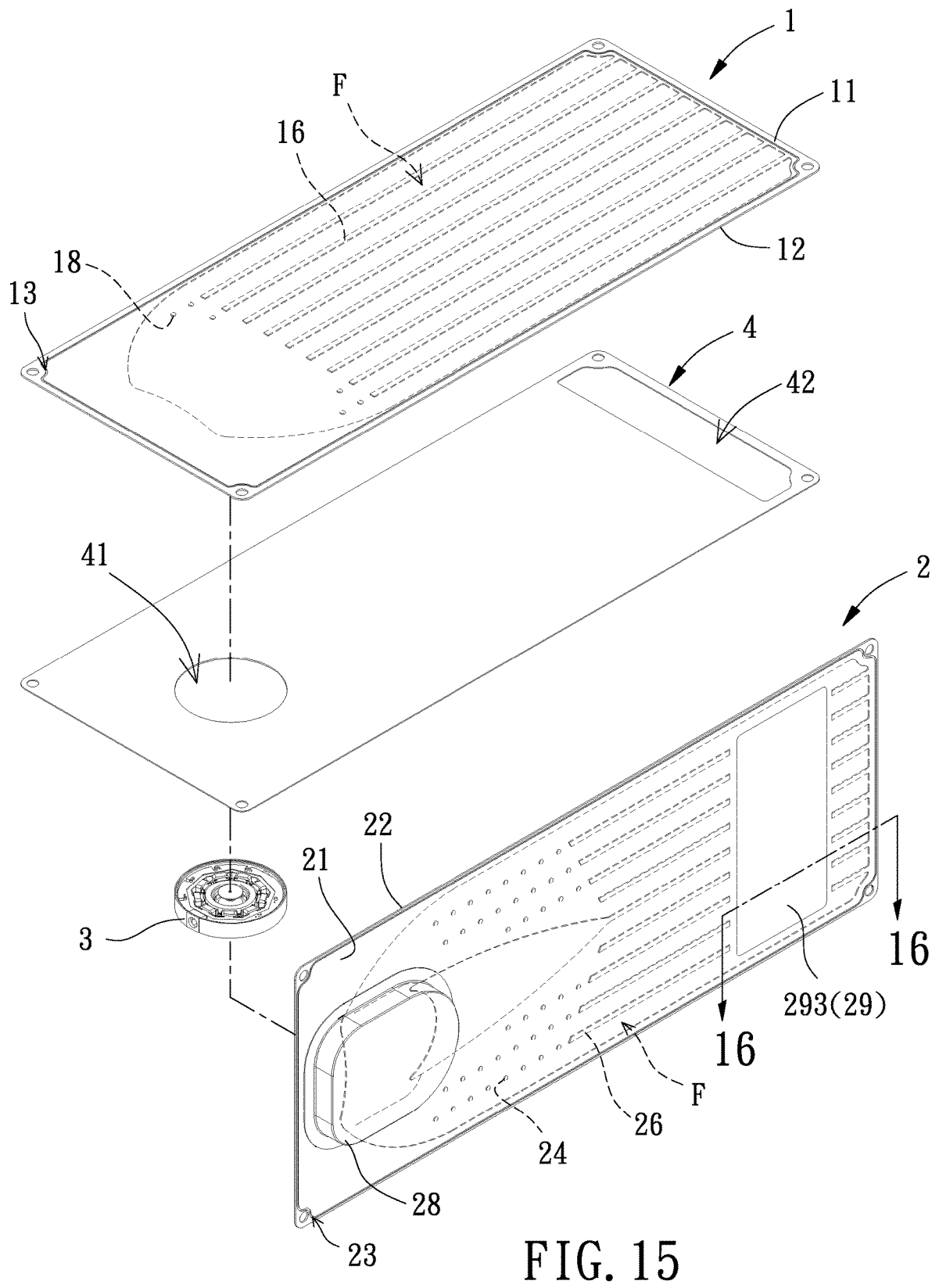
FIG. 15 is an exploded, perspective view of a cooling device of a sixth embodiment according to the present invention.
Figure 16:
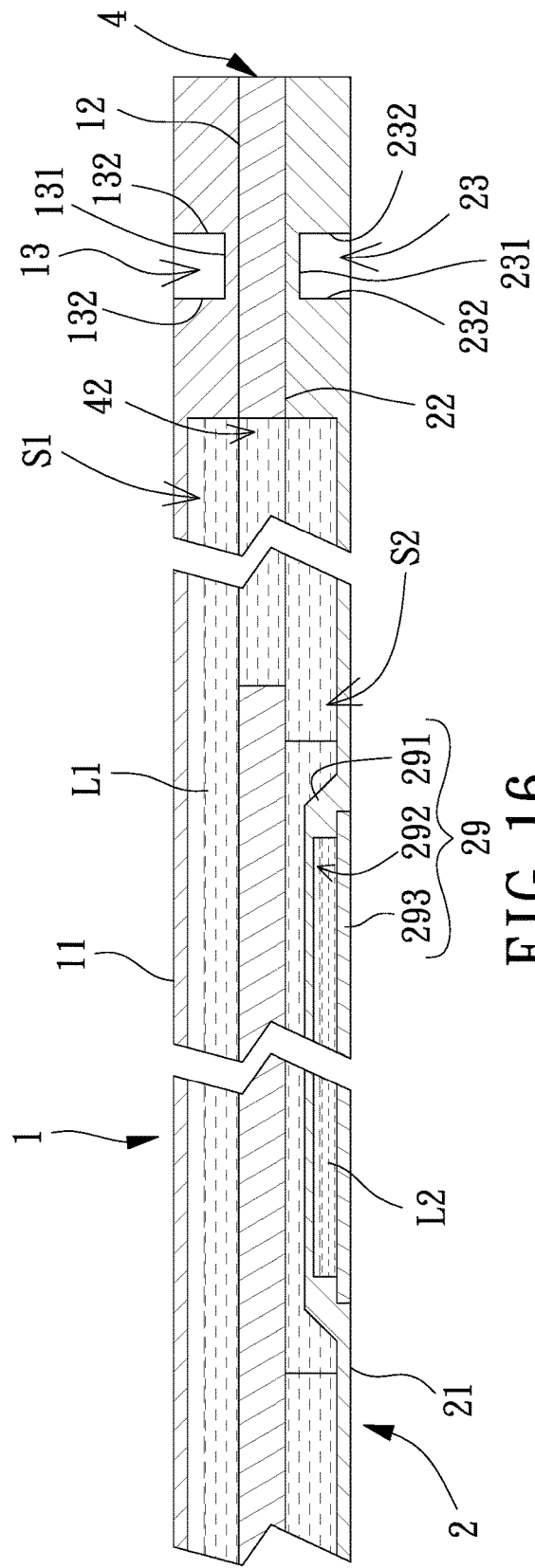
FIG. 16 is a cross sectional view taken along section line 16-16 of FIG. 15 after assembly.

FIGS. 15 and 16 show a cooling device with an easy-to-weld structure of a sixth embodiment according to the present invention. This embodiment is substantially the same as the fifth embodiment. The vapor chamber in this embodiment is disposed on the first board 1 or the second board 2, rather than the partitioning board 4. Alternatively, the vapor chamber is still disposed on the partitioning board 4, but another vapor chamber is disposed on the first board 1 or the second board 2. An example of the vapor chamber disposed on the second board 2 instead of the partitioning board 4 will be set forth hereinafter as a non-restrictive example.

More specifically, the second board 2 includes an auxiliary cooling portion 29 having a wall 291 protruding in the second chamber S2. The wall 291 includes a recess 292 on the outer side of the second board 2. The recess 292 is filled with a phase-change fluid L2 and is sealed by a lid 293. The recess 292 neither intercommunicates with the second chamber S2 nor the first chamber S1. Preferably, the auxiliary cooling portion 29 extends across the plurality of fluid passages F in the second chamber S2. Furthermore, the plurality of partitioning ribs 26 of the second board 2 can be discontinuous for disposing the auxiliary cooling portion 29. Thus, this embodiment can further improve the cooling efficiency to the heat source H by the auxiliary cooling portion 29.

Figure 17:
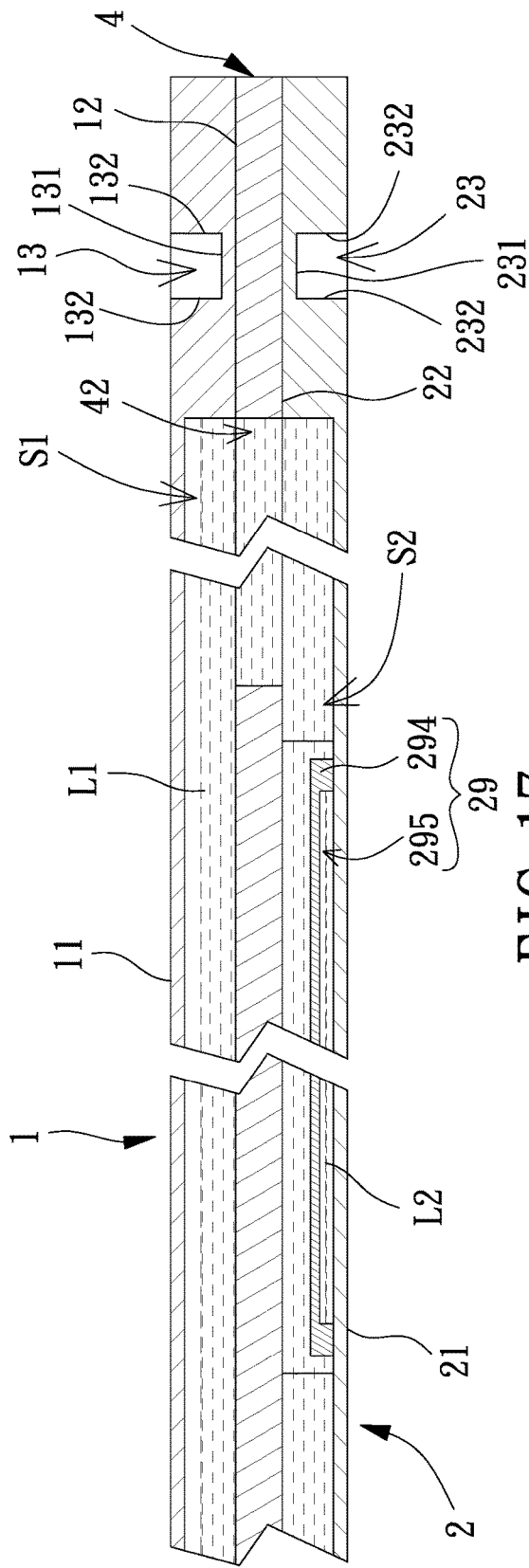
FIG. 17 is a cross sectional view of a part of a cooling device of a seventh embodiment according to the present invention.

FIG. 17 shows a cooling device with an easy-to-weld structure of a seventh embodiment according to the present invention. The auxiliary cooling portion 29 of this embodiment includes a lid body 294 having a groove therein. The lid body 294 is coupled to a face of the second board 2 facing the partitioning board 4, such that the groove in the lid body 294 forms a phase-change chamber 295 filled with a phase-change fluid L2. The phase-change chamber 295 neither intercommunicates with the second chamber S2 nor the first chamber S1. Thus, this embodiment also can further improve the cooling efficiency to the heat source H by the auxiliary cooling portion 29.

Figure 18:
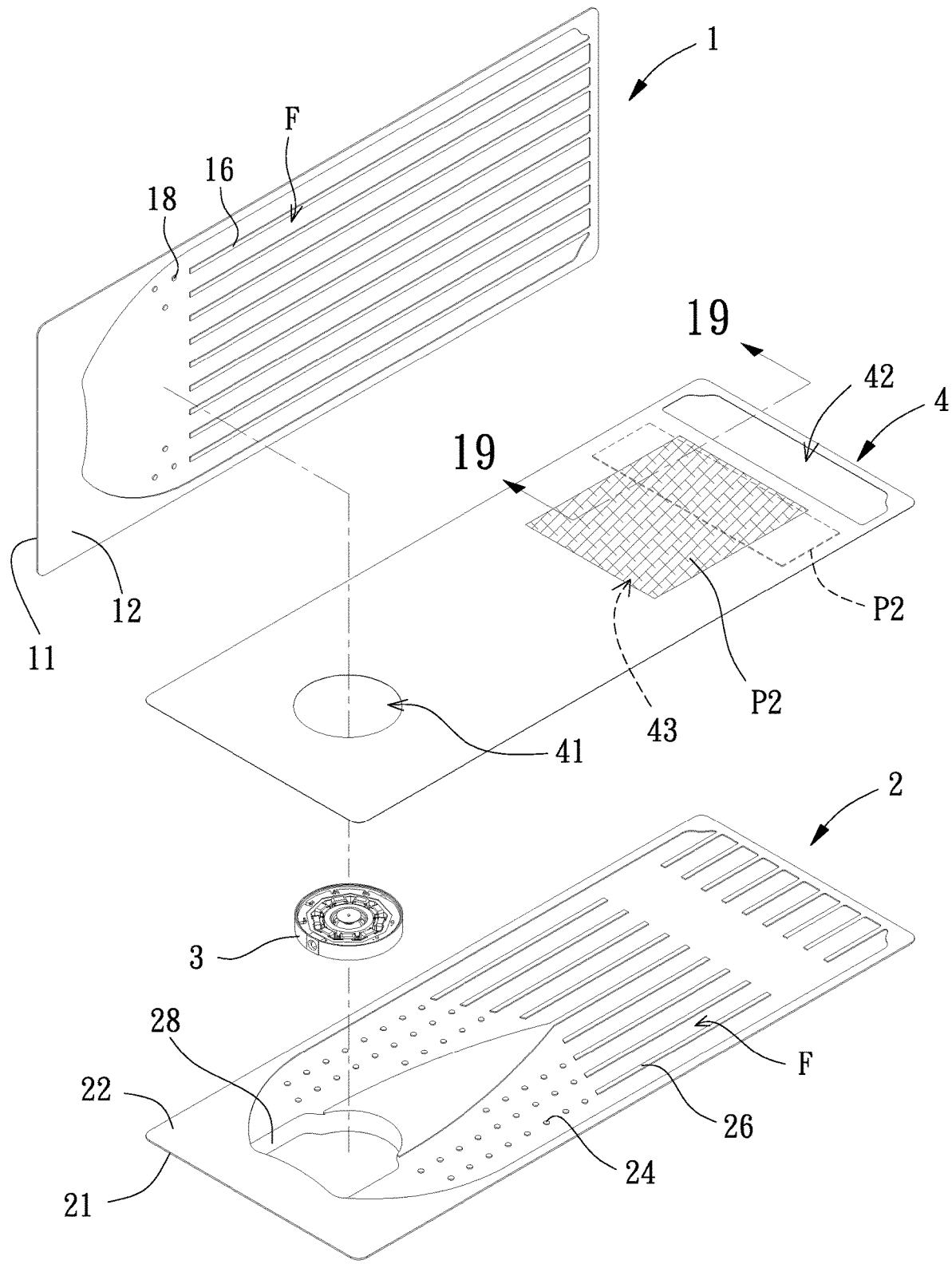
FIG. 18 is an exploded, perspective view of a cooling device of an eighth embodiment according to the present invention.

FIGS. 18 and 19 show a cooling device with an easy-to-weld structure of an eighth embodiment according to the present invention. This embodiment is substantially the same as the fifth embodiment. Furthermore, the vapor chamber disposed on the partitioning board 4 is replaced with a coarse structure P2.

More specifically, the partitioning board 4 includes a coarse structure P2 in the sink 43. The coarse structure P2 can be formed by sintering copper powders. The coarse structure P2 is aligned with the plurality of partitioning ribs 16 of the first board 1 and preferably does not extend beyond the sink 43 to avoid the coarse structure P2 from being pressed and deformed by the plurality of partitioning ribs 16. Furthermore, the second chamber S2 can also include a coarse structure P2. In an example shown in FIG. 19, the coarse structure P2 is disposed on a face of the partitioning board 4 facing the second board 2. In another example shown in FIG. 20, the coarse structure P2 is disposed on a face of the second board 2 facing the partitioning board 4. Furthermore, the plurality of partitioning ribs 26 of the second board 2 can be discontinuous to mate with the coarse structure P2. Preferably, the coarse structure P2 in the second chamber S2 extends across the plurality of fluid passages F in the second chamber S2. Thus, the cooling device with the easy-to-weld structure can further improve the cooling efficiency to the heat source H by the coarse structure P2.

It is worth mentioning that the cooling device with the easy-to-weld structure in each of the fifth to eighth embodiments can be a liquid cooling module or a device having similar functions. Since both the first board 1 and the second board 2 are coupled to the partitioning board 4 by laser welding, each of the first board 1 and the second board 2 preferably includes an annular welding channel 13, 23 to assure that laser welding can be conducted on an easy-to-weld structure formed at a portion having a reduced board thickness when proceeding with laser welding on two sides of the cooling device with the easy-to-weld structure, shortening the time of laser welding procedure and reducing the consumed energy. Furthermore, the annular welding channel 13 of the first board 1 and the annular welding channel 23 of the second board 2 can be in identical or different forms. All of these can be appreciated by one having ordinary skill in the art and, thus, should not be restricted by the forms shown in the figures. Moreover, the annular welding channel 13 of the first board 1 and the annular welding channel 23 of the second board 2 can be misaligned from each other (as shown in FIGS. 13, 14, and 19) or aligned with each other (as shown in FIGS. 16, 17, and 20). In the case of alignment, the partitioning board 4 separating the first board 1 from the second board 2 can prevent partial deformation or damage to the board material caused by the laser welding. In addition, laser welding can be conducted on the same location on any side without realigning the relative position of the laser head and the workpiece, improving the processing efficiency.

In view of the foregoing, in the cooling device with the easy-to-weld structure according to the present invention, since the first board and/or the second board is thinner at the annular welding channel to form the easy-to-weld structure, the laser beam can penetrate the first board or the second board more easily during the laser welding. Thus, the time required for forming a weld pool from the material at the interconnection of the first board and the second board is shorter than that at other portions that are thicker, and the overall energy consumed by the laser welding is reduced, improving the laser welding efficiency and reducing the laser welding costs.

Although the invention has been described in detail with reference to its presently preferable embodiments, it will be understood by one of ordinary skill in the art that various modifications can be made without departing from the spirit and the scope of the invention, as set forth in the appended claims.

What is claimed is:

1. A cooling device with an easy-to-weld structure, comprising:
   two boards each including an outer face and an inner face opposite to the outer face;
   a partitioning board abutting the inner faces of the two boards, wherein a first chamber is defined between the partitioning board and one of the two boards, wherein a second chamber is defined between the partitioning board and another of the two boards, wherein the first chamber intercommunicates with the second chamber via an intercommunication port and a backflow port of the partitioning board; and
   a pump configured to drive a working fluid to circulate in the first chamber and the second chamber,
   wherein the outer face of each of the two boards includes an annular welding channel, wherein the welding channels of the two boards surround the first chamber and the second chamber, respectively, wherein each annular welding channel has a channel bottom face, wherein a smallest distance between the channel bottom face of each annular welding channel and the inner face of a respective one of the two boards which includes the annular welding channel is smaller than a smallest distance between the outer face and the inner face of the respective one of the two boards which includes the annular welding channel, and wherein the two boards are coupled to the partitioning board along the annular welding channels by laser welding, and wherein the annular welding channel includes two sidewalls opposite to each other, and wherein two sidewalls are connected to the channel bottom face.

2. The cooling device with the easy-to-weld structure as claimed in claim 1, wherein the annular welding channels of the two boards are misaligned from or aligned with each other.

3. The cooling device with the easy-to-weld structure as claimed in claim 1, wherein at least one of the two boards includes a plurality of partitioning ribs located in the first chamber or the second chamber, wherein each two adjacent partitioning ribs have a fluid passage therebetween, and wherein each of the plurality of partitioning ribs includes a groove having an opening at the outer face of an associated one of the two boards.

4. The cooling device with the easy-to-weld structure as claimed in claim 1, wherein at least one of the two boards includes a plurality of supporting posts located in the first chamber or the second chamber, and wherein each of the plurality of supporting posts includes a dimple at the outer face of an associated one of the two boards.

5. The cooling device with the easy-to-weld structure as claimed in claim 1, wherein the partitioning board includes a sink filled with a phase-change fluid, and wherein the sink is sealed by a cover and neither intercommunicates with the first chamber nor the second chamber.

6. The cooling device with the easy-to-weld structure as claimed in claim 1, wherein the partitioning board includes a sink having a coarse structure.

7. The cooling device with the easy-to-weld structure as claimed in claim 1, wherein at least one of the two boards includes a plurality of partitioning ribs located in the first chamber or the second chamber, wherein each two adjacent partitioning ribs have a fluid passage therebetween, wherein a coarse structure is disposed on the partitioning board or the at least one of the two boards which includes the plurality of partitioning ribs, and wherein the coarse structure extends across the fluid passages.

8. The cooling device with the easy-to-weld structure as claimed in claim 1, wherein at least one of the two boards includes a plurality of partitioning ribs located in the first chamber or the second chamber, wherein each two adjacent partitioning ribs have a fluid passage therebetween, and wherein at least one of the two boards includes an auxiliary cooling portion extending across the fluid passages.

9. The cooling device with the easy-to-weld structure as claimed in claim 8, wherein the auxiliary cooling portion includes a wall protruding in the first chamber or the second chamber, wherein the wall includes a recess in an outer side of a respective one of the two boards, wherein the recess is filled with a phase-change fluid and is sealed by a lid, and wherein the recess neither intercommunicates with the first chamber nor the second chamber.

10. The cooling device with the easy-to-weld structure as claimed in claim 8, wherein the auxiliary cooling portion includes a lid body coupled to a face of a respective one of the two boards facing the partitioning board, wherein the lid body defines a phase-change chamber filled with a phase-change fluid, and wherein the phase-change chamber neither intercommunicates with the first chamber nor the second chamber.

11. The cooling device with the easy-to-weld structure as claimed in claim 1, wherein the annular welding channel is formed on the respective one of the two boards by etching.

12. The cooling device with the easy-to-weld structure as claimed in claim 1, wherein the inner face of the respective one of the two boards and the channel bottom face are connected to a lateral face of the respective one of the two boards.

13. The cooling device with the easy-to-weld structure as claimed in claim 1, wherein the working fluid is an electrically non-conductive liquid.

* * * * *